United States Patent [19]

Teng et al.

[11] Patent Number: 4,916,524
[45] Date of Patent: Apr. 10, 1990

[54] DRAM CELL AND METHOD

[75] Inventors: Clarence W. Teng; Robert R. Doering, both of Plano; Ashwin H. Shah, Dallas, all of Tex.

[73] Assignee: Texas Instruments Incorporated, Dallas, Tex.

[21] Appl. No.: 300,467

[22] Filed: Jan. 23, 1989

Related U.S. Application Data

[62] Division of Ser. No. 26,356, Mar. 16, 1987.

[51] Int. Cl.⁴ .................. H01L 29/78; H01L 29/06; H01L 27/02
[52] U.S. Cl. ................................... 357/23.6; 357/55; 357/41
[58] Field of Search .................. 357/23.6, 55; 437/52

[56] References Cited

U.S. PATENT DOCUMENTS

| | | | |
|---|---|---|---|
| 4,240,092 | 12/1980 | Kuo | 357/23.6 |
| 4,462,040 | 7/1984 | Ho et al. | 357/23 |
| 4,649,625 | 3/1987 | Lu | 29/571 |
| 4,651,184 | 3/1987 | Malhi | 357/23.6 |
| 4,672,410 | 6/1987 | Miura et al. | 357/23.6 |
| 4,673,962 | 6/1987 | Chatterjee et al. | 357/23.6 |
| 4,683,486 | 7/1987 | Chatterjee | 357/23.6 |
| 4,751,558 | 6/1988 | Kenney | 357/23.6 |

FOREIGN PATENT DOCUMENTS

| | | | |
|---|---|---|---|
| 186875 | 7/1986 | European Pat. Off. | |
| 0187237 | 7/1986 | European Pat. Off. | 357/23.6 |
| 198590 | 10/1986 | European Pat. Off. | |
| 58-213464 | 12/1983 | Japan | |
| 59-141262 | 8/1984 | Japan | |
| 73366 | 4/1986 | Japan | 357/23.6 |

Primary Examiner—Rolf Hille
Assistant Examiner—Robert P. Limanek
Attorney, Agent, or Firm—Carlton H. Hoel; Thomas W. DeMond; Melvin Sharp

[57] ABSTRACT

The described embodiments of the present invention provide structures, and a method for fabricating those structures, which include a memory cell formed within a single trench. A trench is formed in the surface of a semiconductor substrate. The bottom portion of the trench is filled with polycrystalline silicon to form one plate of a storage capacitor. The substrate serves as the other plate of the capacitor. The remaining portion of the trench is then filled with an insulating material such as silicon dioxide. A pattern is then etched into the silicon dioxide when opens a portion of the sidewall and the top portion of the trench down to the polycrystalline capacitor plate. A contact is then formed between the polycrystalline capacitor plate and the substrate. Dopant atoms diffuse through the contact to form a source region on a sidewall of the trench. A gate insulator is formed by oxidation and a drain is formed at the surface of the trench adjacent to the mouth of the trench. Conductive material is then formed inside the open portion of the upper portion of the trench thereby forming a transistor connecting the upper plate of the storage capacitor to a drain region on the surface of the semiconductor substrate.

12 Claims, 20 Drawing Sheets

DRAM CELL AND METHOD

This is a division of application Ser. No. 07/026,356, filed Mar. 16, 1987.

FIELD OF THE INVENTION

The present invention relates to the field of integrated circuitry. More specifically, the present invention relates to the field of dynamic random access memories.

BACKGROUND OF THE INVENTION

The quest for smaller and smaller memory cells to allow more and more memory capacity in integrated circuit memories is a well known goal. The search for methods of fabricating higher density memories has led some to place an entire memory cell including transistor and a storage capacitor in a single deep cavity (trench) formed on the surface of integrated circuit substrate. See, for example, U.S. Pat. Application Ser. No. 679,663, which is assigned to the assignee of the present application, and is hereby incorporated by reference. The inclusion of both the transistor and the capacitor in a single trench has led to parasitic capacitance problems. Specifically the bit line and word line capacitive coupling to the memory cell is great enough to disrupt the data stored in the memory cell. In addition, the transistor structure in the above mentioned application provides a toroidal shaped source drain and channel region. This increased area in the structure of the transistor creates leakage problems from both the bit line and the storage node. Several memory cell designs have used polysilicon transistors which are enclosed within the trench. However, the channel leakage characteristics of polycrystalline silicon transistors are inferior to those of transistors formed in bulk silicon. For an example of a memory cell using a polycrystalline transistor see published European Pat. Application Ser. No. 108,390, which is hereby incorporated by reference.

SUMMARY OF THE INVENTION

The described embodiments of the present invention provide structures, and a method for fabricating those structures, which include a memory cell formed within a single trench. A trench is formed in the surface of a semiconductor substrate. The bottom portion of the trench is filled with polycrystalline silicon to form one plate of a storage capacitor. The substrate serves as the other plate of the capacitor. The remaining portion of the trench is then filled with an insulating material such as silicon dioxide. A pattern is then etched into the silicon dioxide which opens a portion of the sidewall and the top portion of the trench down to the polycrystalline capacitor plate. A contact is then formed between the polycrystalline capacitor plate and the substrate. Dopant atoms diffuse through the contact to form a source region on a sidewall of the trench. A gate insulator is formed by oxidation and a drain is formed at the surface of the trench adjacent to the mouth of the trench. Conductive material is then formed inside the open portion of the upper portion of the trench thereby forming a transistor connecting the upper plate of the storage capacitor to a drain region of the surface of the semiconductor substrate.

DETAILED DESCRIPTION

Figure 2:
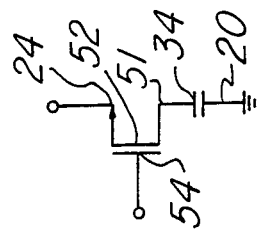
FIG. 2 is an electrical schematic diagram indicating the electrical function of the cell shown in FIG. 1.
Figure 1:
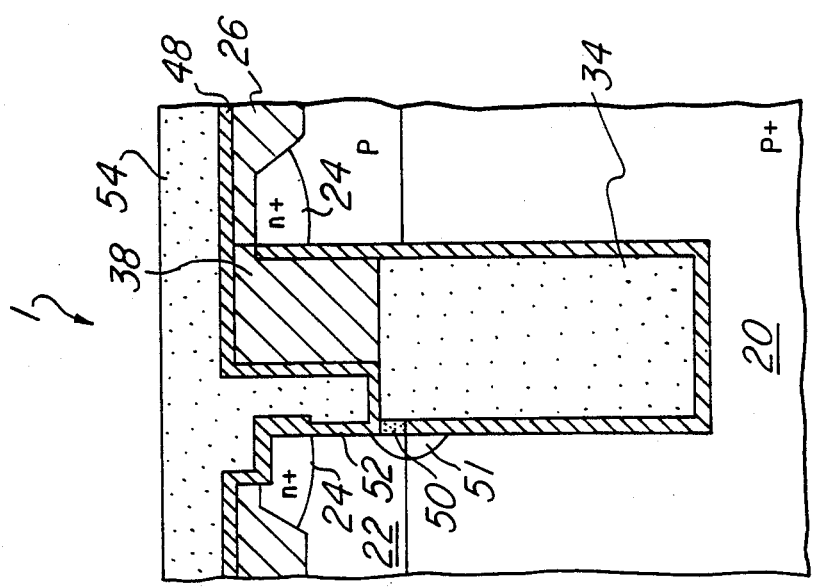
FIG. 1 is a side view schematic diagram of one embodiment of the present invention.
Figure 4:
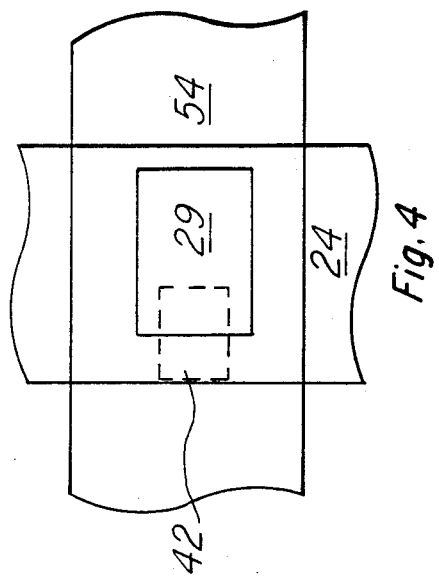
FIG. 4 is a schematic plan view showing the surface layout configuration of the memory cell shown in FIG. 1.
Figure 5:
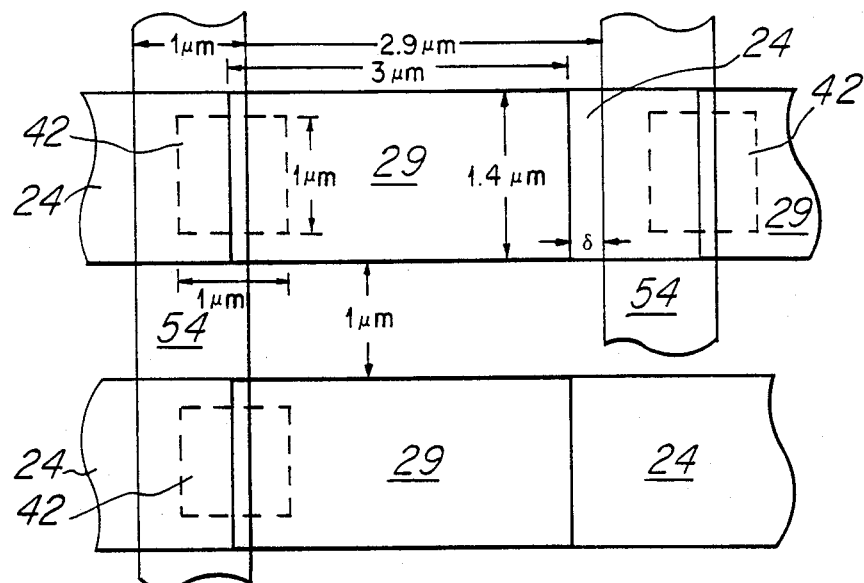
FIG. 5 is a plan view of an alternate layout scheme for the memory cell shown in FIG. 1.
Figure 6:
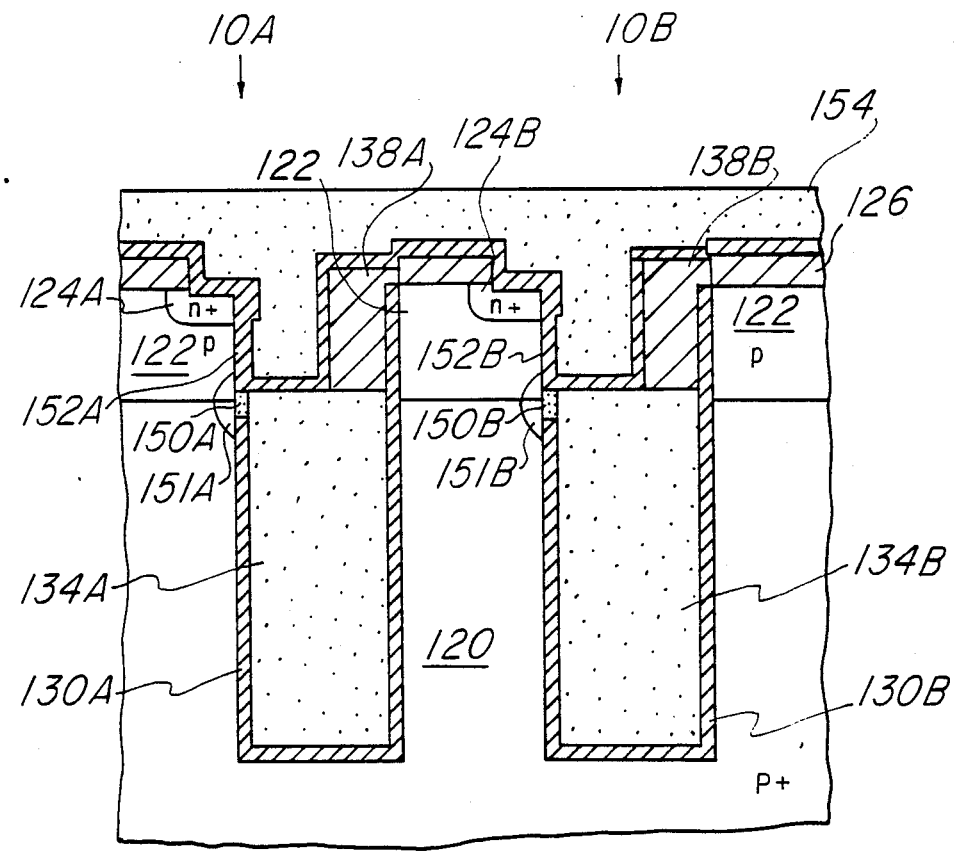
FIG. 6 is a side view schematic diagram of two memory cells which are embodiments of the present invention.

Three types of dynamic random access memory cells are described in this detailed description. All are embodiments of the present invention as are the methods for fabricating them. All of the memory cells provide a one transistor one capacitor memory cell with a conductive plug in a trench serving as the one capacitor plate and the substrate serving as the other capacitor plate. FIG. 1 is one of these memory cells. Its electrical characteristics are illustrated in FIG. 2 and the steps for fabricating it are illustrated in FIGS. 3A through 3I. FIG. 4 and 5 are layout schemes for using the memory cell of FIG. 1 in a memory array system. FIG. 6 is a side view schematic diagram of two memory cells of another type memory cell. The method for fabricating those cells is described in FIGS. 7A through 7I and a layout scheme for this type of memory cell is described in FIG. 8. FIGS. 9A through 9M show another process for fabricating the cells which are another embodiment of the invention.

Memory cell 1 of FIG. 1 includes a polycrystalline silicon layer 54 running parallel to the plane of the page which serves as a word line for the memory array. In addition, polycrystalline silicon layer 54 extends into the trench to serve as a transistor gate controlling the channel current in channel 52. N+ region 24 serves as a drain and N region 51 serves as a source for the pass transistor of memory cell 1. Source 51 is connected to polycrystalline silicon capacitor plate 34 via buried lateral contact 50. Buried lateral contact 50 is a polycrystalline silicon region. The other plate of the memory cell capacitor is provided by substrate 20. Substrate 20 is a heavily doped P+ region in order to provide the increased capacitance available with a heavily doped crystalline capacitor plate. FIG. 2 is an electrical schematic diagram indicating how the various components of memory cell 1 (FIG. 1) behave electrically.

Figure 3B:
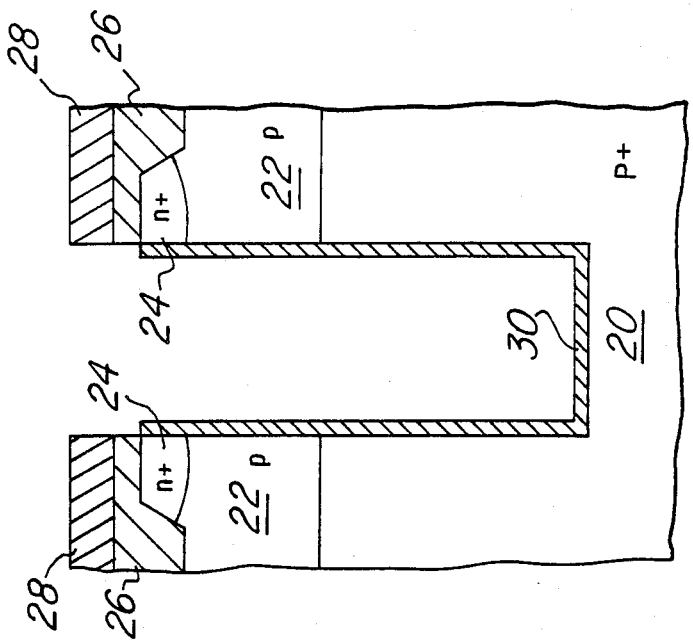
FIGS. 3A through 3I are side view schematic diagrams depicting the processing steps necessary to fabricate the structure shown in FIG. 1.
Figure 3A:
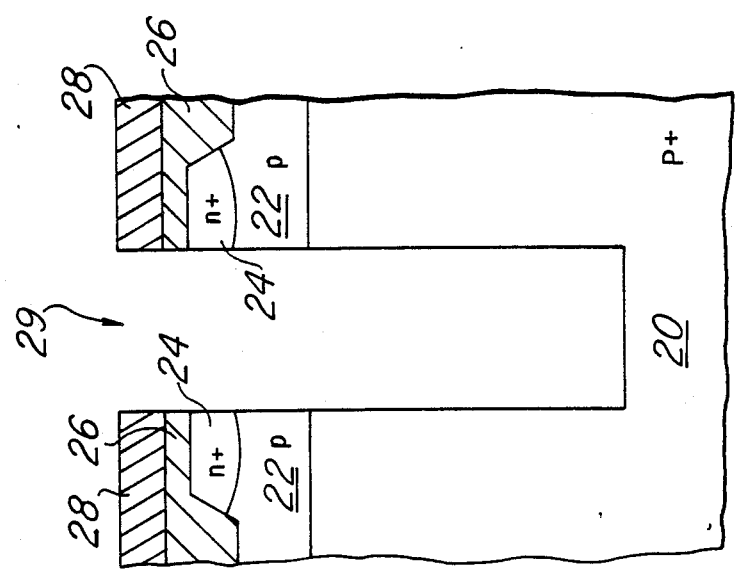

FIGS. 3A through 3I are side view schematic diagrams depicting the processing steps necessary to fabricate memory cell 1 (FIG. 1) the initial steps of the fabrication process include forming P-type epitaxial layer 22, having a thickness of approximately 4μ on the surface of P+ type substrate 20, forming oxide regions 26 including thicker field oxide regions between memory cells and formation of silicon nitride layer 28, having a thickness of approximately 1,500 Å. Silicon dioxide layer 26 is of conventional recessed field oxide region type with a surface oxide layer in the areas where the memory cells are to be fabricated. Several techniques are well known in the art for a layer such as silicon dioxide layer 26. An example is shown in U.S. Pat. No. 4,541,167. The entire wafer is subjected to an ion implantation sufficient to penetrate the thin regions of oxide layer 26 but insufficient to penetrate the thick regions silicon dioxide layer 26. With the thin portion of silicon dioxide layer 26 being approximately 350 Å and the thick portions being approximately 8,000 Å, an ion implantation having an energy of approximately 150 KeV and a density of approximately $1 \times 10^{16}$ ions/cm$^3$ will provide an adequate N+ region 24. This forms N+ regions 24 as shown in FIG. 3A. Silicon nitride layer 28 is then patterned and etched to provide a mask for etching trench 29. Trench 29 is etched using an anisotropic etching process such as that described in copending application Ser. No. 730,701 to a depth of approximately 8$\mu$. The structure of FIG. 3A is then subjected to thermal oxidation in oxygen at a temperature of approximately 850° C. for approximately 80 minutes. This forms silicon dioxide layer 30 to a thickness of approximately 150 Å as shown in FIG. 3B.

Figure 3C:
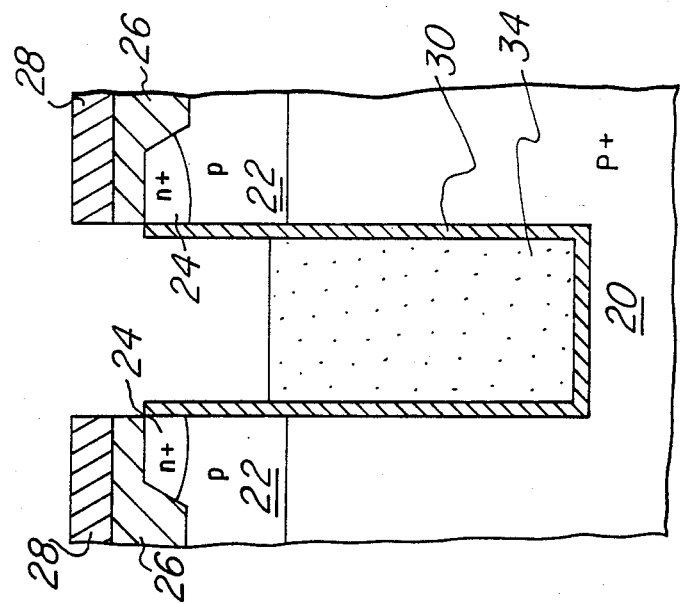

A deposition of heavily doped N type polycrystalline silicon using chemical vapor deposition of silane is then performed to form polycrystalline silicon layer 32 on the structure of FIG. 3B as shown in FIG. 3C. The thickness of polycrystalline silicon layer 32 is chosen so as to completely fill trench 29 (FIG. 3A). The thickness must be at least approximately half the minimum width of the trench. For example, with a trench 1$\mu$ by 2$\mu$ wide, a polycrystalline silicon deposition of at least 5000 Å (one half of one $\mu$) is necessary to fill the trench.

Figure 3D:
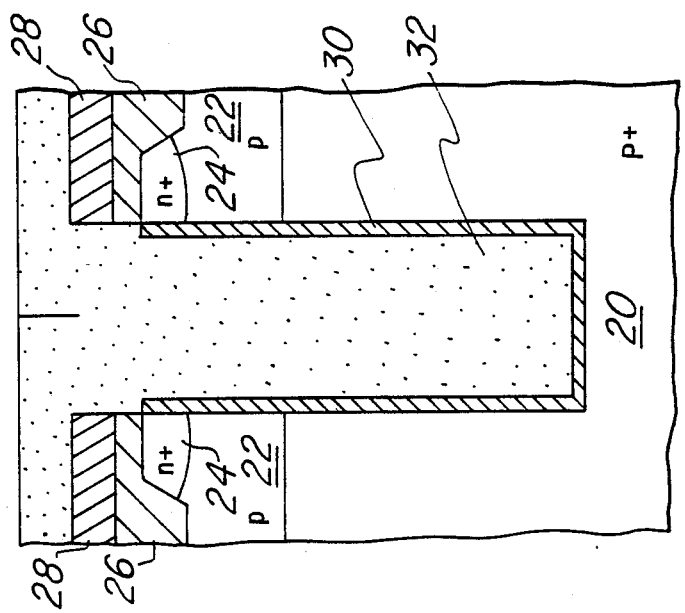
Figure 3F:
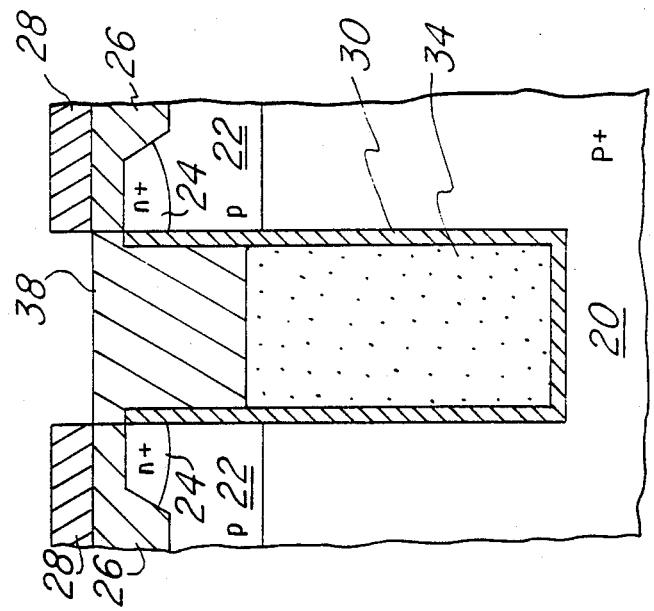
Figure 3E:
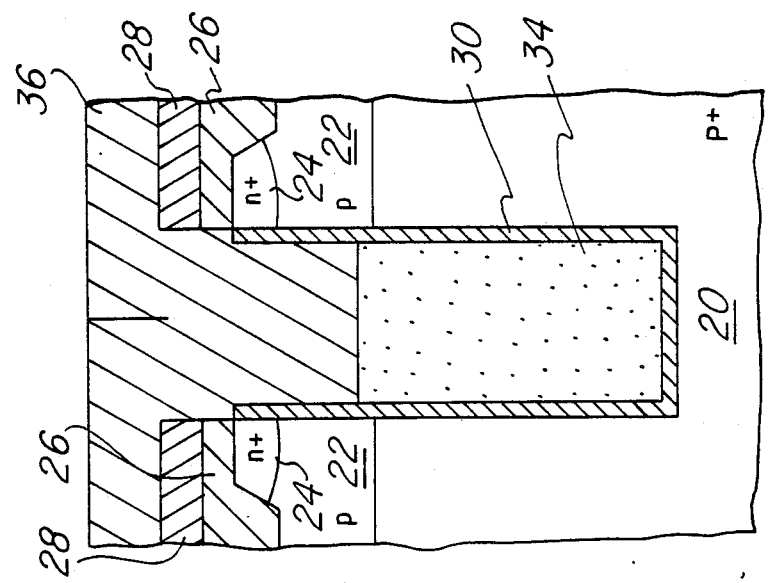

An isotropic etching process is then performed on polycrystalline layer 32 in order to etch polycrystalline silicon layer 32 back to a level inside the trench as shown in FIG. 3D. The resulting structure is polycrystalline silicon plug 34. The preferred level for the top of polycrystalline silicon plug 34 is above the transition between substrate 20 and epitaxial layer 22. Silicon dioxide layer 36 is then deposited using chemical vapor deposition as shown in FIG. 3E to a thickness necessary to fill trench 29 (FIG. 1). Again, silicon dioxide layer 36 must be deposited to a thickness at least approximately half the minimum dimension of trench 29. Silicon dioxide layer 36 is then etched back to a level approximately even with the top level of silicon dioxide layer 26 to form silicon dioxide plug 38.

Figure 3H:
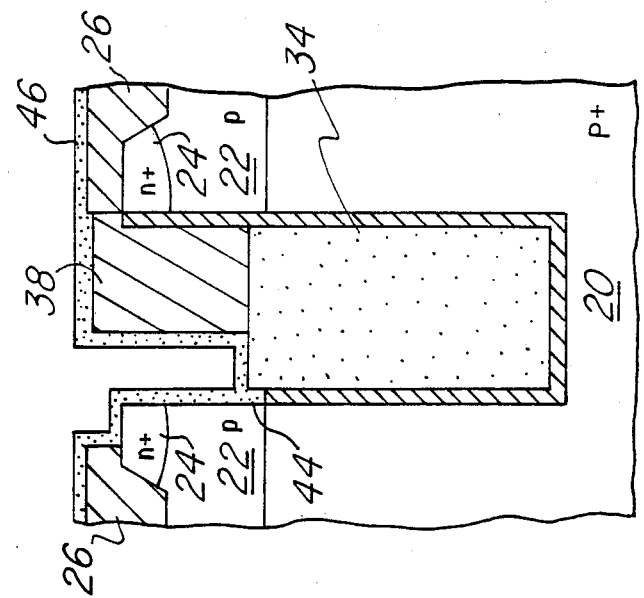
Figure 3G:
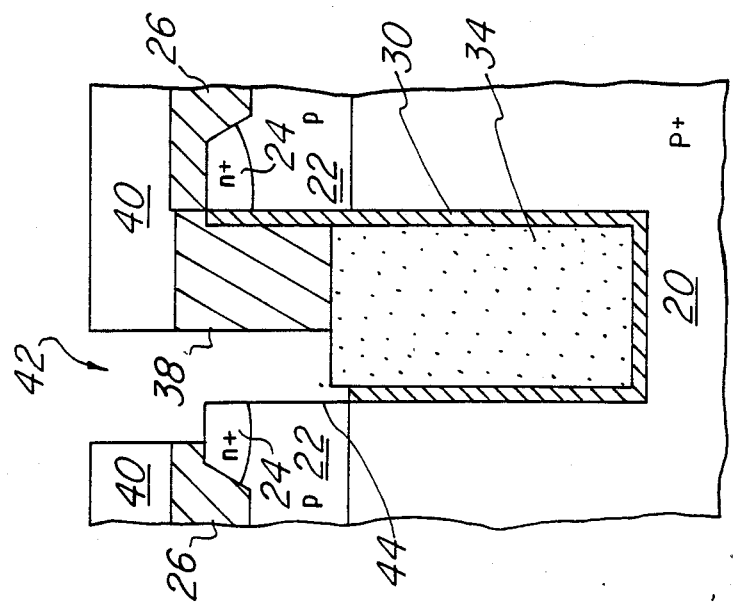
Figure 3I:
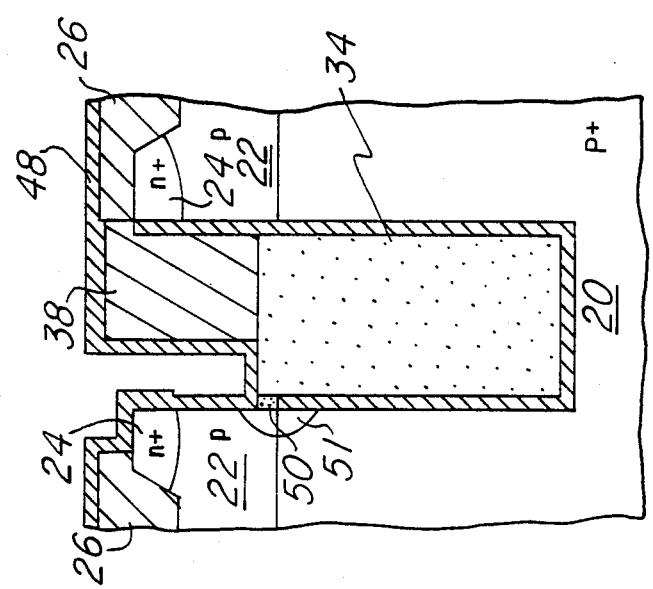

Silicon nitride layer 28 is then removed and photoresist layer 40 is deposited to a thickness of approximately 1$\mu$ and patterned as shown in FIG. 3G. Photoresist layer 40 serves as a mask for anisotropically etching the region left exposed by opening 42. An oxide etching process selective to silicon, such as plasma etching using CHF$_3$/C$_2$F$_6$, is performed and the etching process is continued until silicon dioxide plug 38 is etched completely through to polycrystalline silicon plug 34 and then overetched to open area 44 of silicon dioxide layer 30. A wet etching process may be substituted for this overetching step. Although a selective etching process is used, complete selectively to silicon is not possible and some etching of epitaxial layer 22 at N-type region 24 will occur. Photoresist layer 40 is removed and polycrystalline silicon layer 46 is deposited to a thickness of approximately 150 Å by chemical vapor deposition of silane. The thickness of polycrystalline silicon layer 46 is chosen so as to fill opening 44 as shown in FIG. 3H. The structure of FIG. 3H is then subjected to an oxidation process in a steam ambient at a temperature of 900° C. for a period of 10 minutes. This oxidation process completely oxidizes polycrystalline silicon layer 46 to provide silicon dioxide layer 48 having a thickness of 400 Å as shown in FIG. 3I. Because of its position relative to the oxidizing ambient, the portion of polycrystalline silicon layer 46 (FIG. 3H) in opening 44 will not oxidize thus leaving polycrystalline silicon buried lateral contact 50. Silicon dioxide layer 48 is removed by wet etching using dilute hydrofluoric acid and then regrown by thermal oxidation in an oxygen ambient at approximately 850° C. for approximately 80 minutes to form a new silicon dioxide layer 48 which serves as a high quality gate oxide. During the oxidation process N-type dopant atoms in polycrystalline silicon plug 34 will diffuse through buried lateral contact 50 and form N-type region 51. Polycrystalline silicon layer 54 is then deposited using chemical vapor deposition of silane to a thickness of approximately 4,500 Å and patterned to form gates and word lines as shown in FIG. 1.

A plan view diagram showing the relative positions of trench 29, word line 54 and N+ regions 24, which serve as a bit line, are shown in FIG. 4. FIG. 5 is a plan view showing another layout method incorporating the cell shown in FIG. 1. Word lines 54 are formed perpendicular to bit lines 24. A bit lines 24 are formed parallel to the major access of the memory cell. With this layout, opening 42 must be filled by a prefill of polycrystalline silicon in order to fill the area etched away in opening 42. Contact is then made to polycrystalline silicon layer 54 which serves as a word line. Dimensions are included to show the size of the memory cell according to the present invention with a cell size compatible with the fabrication of a 4 Megabit memory chip. One $\mu$ minimum dimensions are used and 0.2$\mu$ alignment tolerances are used. Note that dimension $\delta$ is very small and is not critical. Because the transistor of memory cell 1 is formed on one side only of the memory cell excepting the side where the transistor is formed. Thus, very dense cell packing can be obtained.

Another embodiment of the present invention is shown in duplicate in FIG. 6. Memory cells 10A and 10B of FIG. 6 include a polycrystalline silicon layer 154 running parallel to the plane of the page which serves as a word line for the memory array. In addition. polycrystalline silicon layer 154 extends into the trenches to serve as a transistor gate controlling the channel current in channels 152A and 152B. N+ regions 124A and 124B serve as a drains and N regions 151A and 151B serve as a sources for the pass transistors of memory cells 10A and 10B. Sources 151A and 151B are connected to polycrystalline silicon capacitor plates 134A and 134B via buried lateral contacts 150A and 150B. Buried lateral contacts 150A and 150B are polycrystalline silicon regions. The other plate of the memory cell capacitors is provided by substrate 120. Substrate 120 is a heavily doped P+ region in order to provide the increased capacitance available with a heavily doped crystalline capacitor plate.

Figures 7A, 7B:
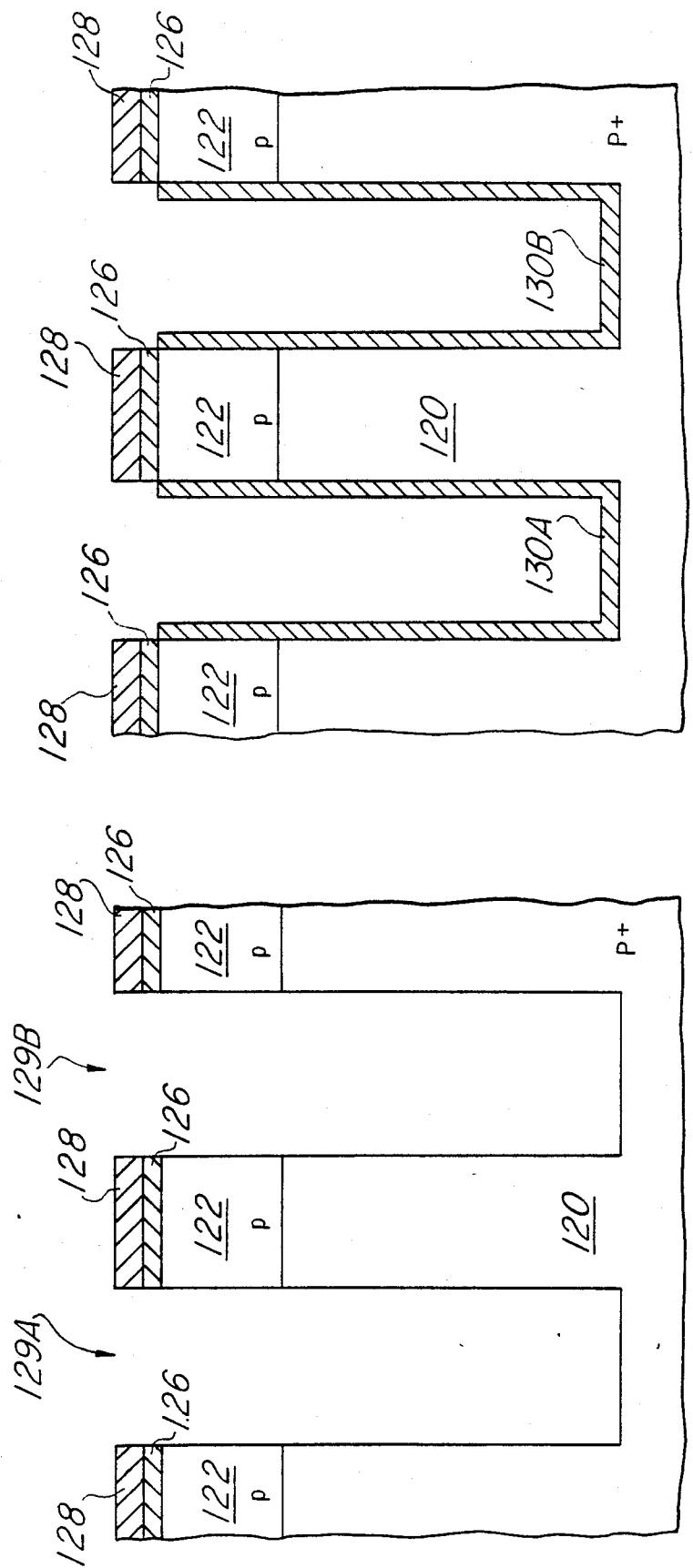
FIGS. 7A through 7I are side view schematic diagrams showing the processing steps used to fabricate the memory cells shown in FIG. 6.

FIGS. 7A through 7I are side view schematic diagrams depicting processing steps for fabricating memory cells 10A and 10B (FIG. 6) the initial steps of the fabrication process include forming P-type epitaxial layer 122, having a thickness of approximately 4$\mu$ on the surface of P+ type substrate 120, forming oxide layer 126 by thermal oxidation or chemical vapor deposition to a thickness of approximately 2,000 Å, and forming silicon nitride layer 128 by chemical vapor deposition, having a thickness of approximately 1,500 Å. Silicon nitride layer 128 is then patterned and etched to provide a mask for etching trenches 129A and 129B. Trenches 129A and 129B are etched using an anisotropic etching process such as that described in copending application Ser. No. 730,701 to a depth of approximately 8$\mu$. The structure of FIG. 7A is then subjected to thermal oxidation in oxygen at a temperature of approximately 850° C. for approximately 80 minutes. This forms silicon dioxide layers 130A and 130B to a thickness of approximately 150 Å as shown in FIG. 7B.

Figure 7C:
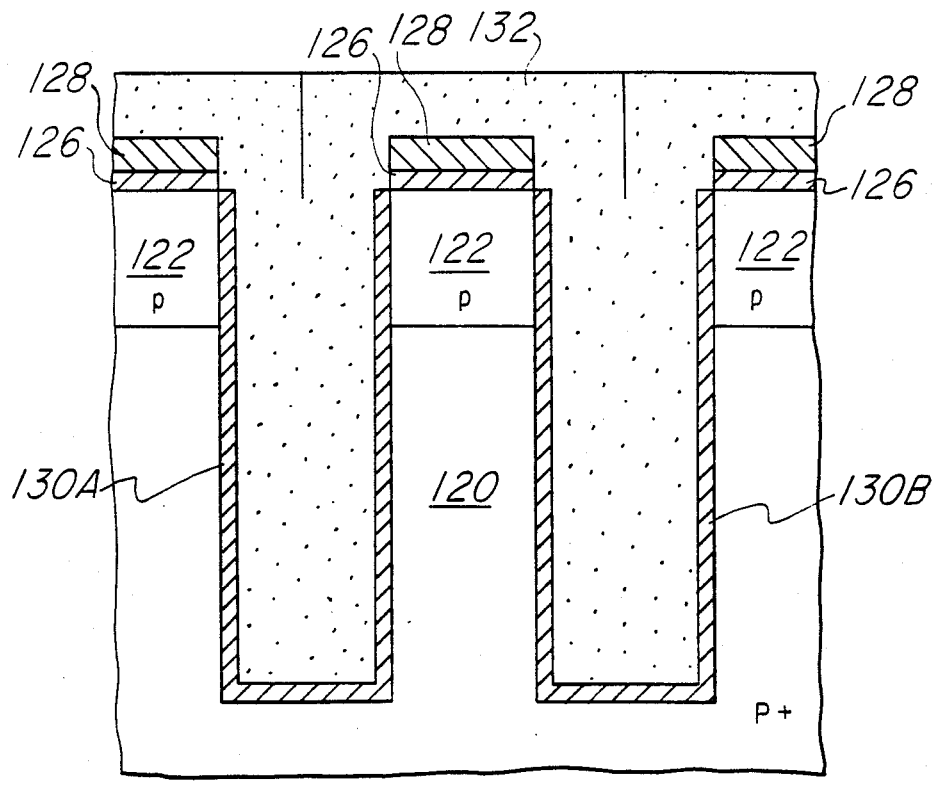

A deposition of heavily doped N type polycrystalline silicon using chemical vapor deposition of silane to form polycrystalline silicon layer 132 on a structure of FIG. 7B is then performed as shown in FIG. 7C. the thickness of polycrystalline silicon layer 132 is chosen so as to completely fill trenches 129A and 129B (FIG. 7A). The thickness must be at least approximately half the minimum width of the trench. For example, with a trench 1$\mu$ by 2$\mu$ wide, a polycrystalline silicon deposition of at least 5000 Å (one half of one $\mu$) is necessary to fill the trench.

Figure 7D:
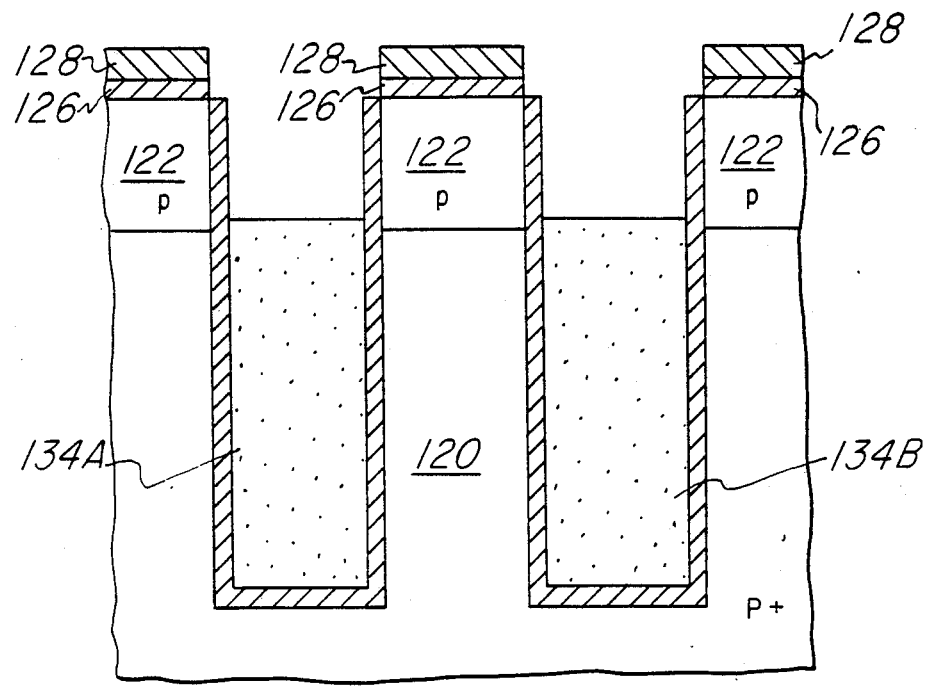
Figure 7E:
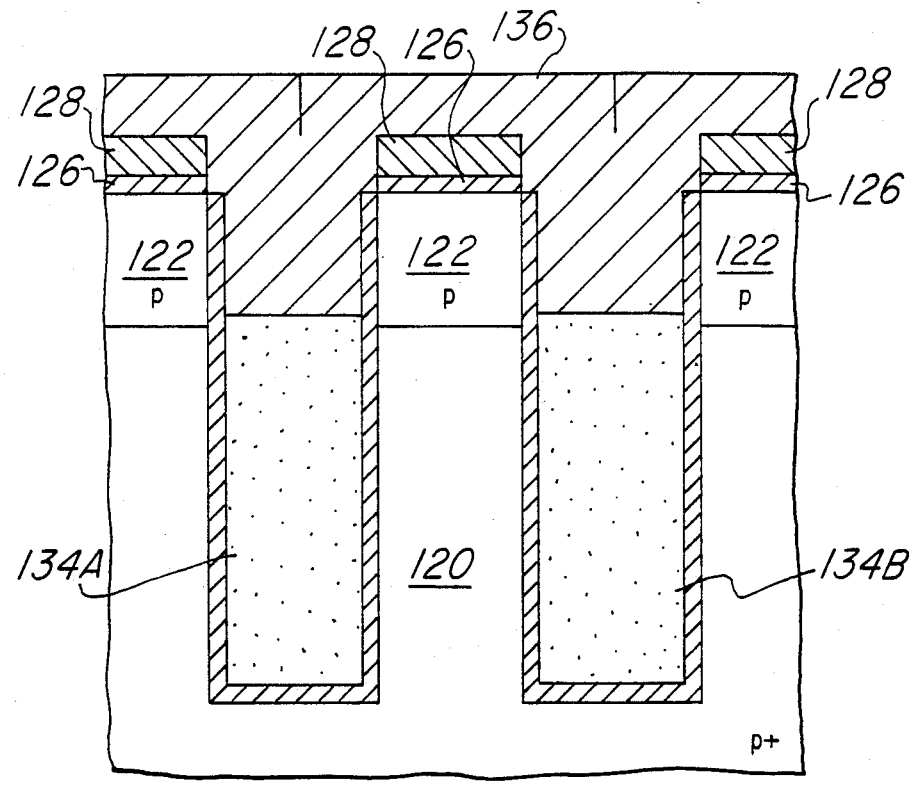
Figure 7F:
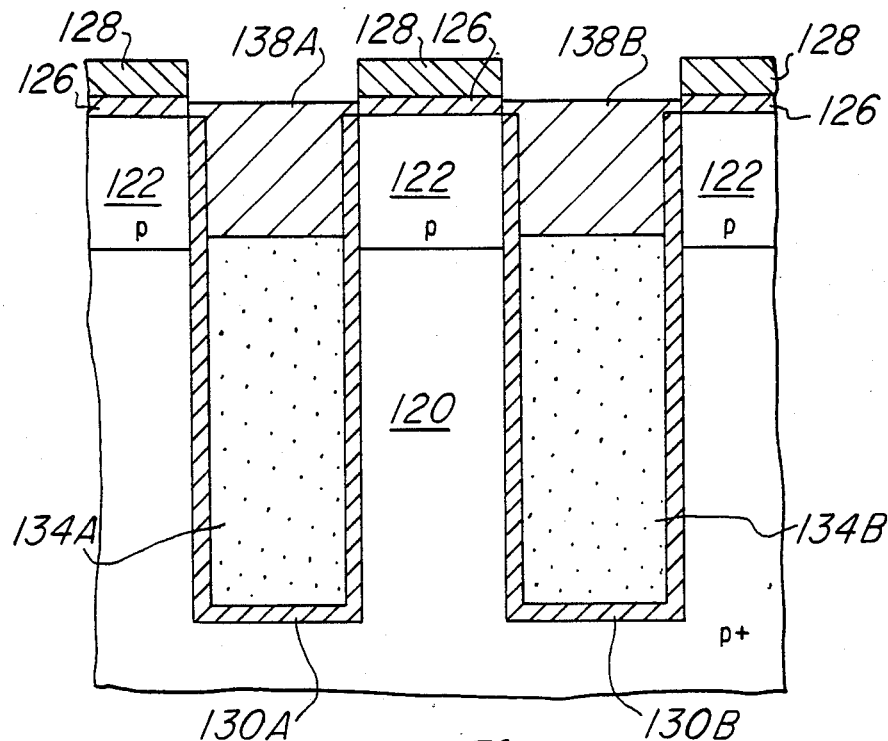

An isotropic etching process is then performed on polycrystalline layer 132 in order to etch polycrystalline silicon layer 132 back to a level inside the trench as shown in FIG. 7D. The resulting structure is polycrystalline silicon plugs 134A and 134B. Silicon dioxide layer 136 is then deposited using chemical vapor deposition as shown in FIG. 7E to a thickness necessary to fill trenches 129A and 129B (FIG. 6). Again, silicon dioxide layer 136 must be deposited to a thickness at least approximately half the minimum dimension of trenches 129A and 129B. Silicon dioxide layer 136 is then etched back to a level approximately even with the top level of silicon dioxide layer 126 to form silicon dioxide plugs 138A and 138B.

Figure 7G:
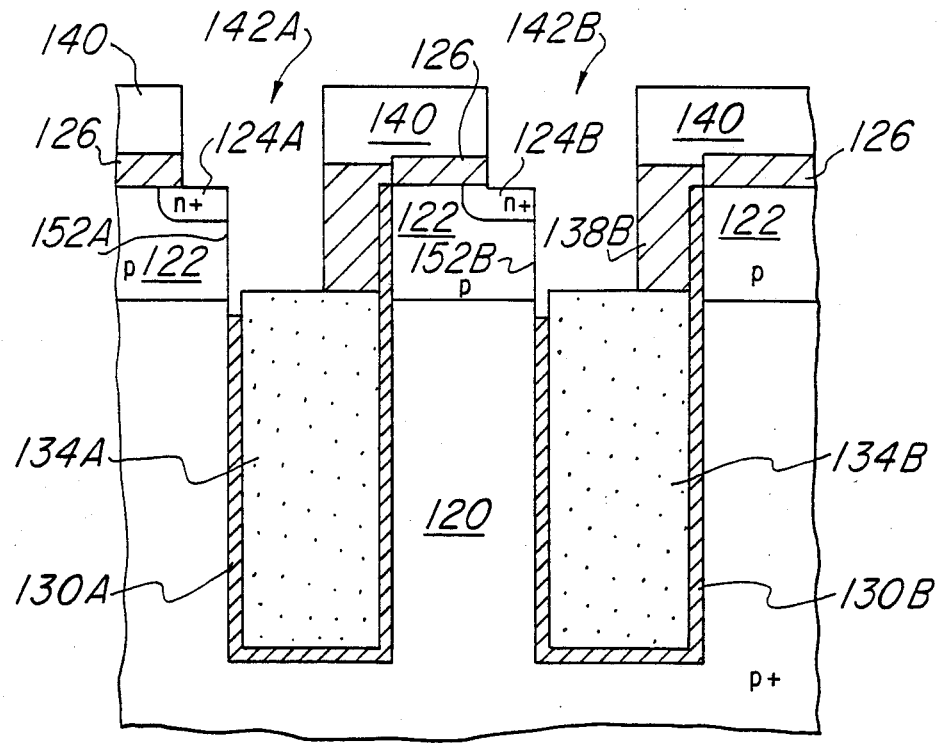

Silicon nitride layer 128 is then removed and photoresist layer 140 is deposited to a thickness of approximately 1$\mu$ and patterned as shown in FIG. 7G. Photoresist layer 140 serves as a mask for anisotropically etching the region left exposed by openings 142A and 142B. A silicon dioxide etching process highly selective to silicon, such as $CHF_3/C_2F_6$, is performed and the etching process is continued until silicon dioxide plugs 138A and 138B are etched completely through to polycrystalline silicon plugs 134A and 134B and then overetched to open areas 144A and 144B of silicon dioxide layers 130A and 130B. A wet etching process may be substituted for this overetching step. Although a selective anisotropic etching process is used, complete selectively to silicon dioxide is not possible and some etching of epitaxial layer 122 will occur. The structure of FIG. 7G is then subjected to an ion implantation of N type dopant ions such as Arsenic at an energy of approximately 100 KeV and a density of approximately $1 \times 10^{16}$ ions/cm$^3$. This ion implantation forms N+ regions 124A and 124B. Polycrystalline silicon plugs 134A and 134B and a portion of silicon dioxide layers 130A and 130B will be doped by the ion implantation, but this does not effect the operation of the memory cells. Because of misalignment or other problems in the ion implanter, some doping of channel regions 152A and 152B may occur. The resulting threshold voltage shift of the memory cell pass transistor can be adjusted using vapor phase doping techniques.

Figure 7H:
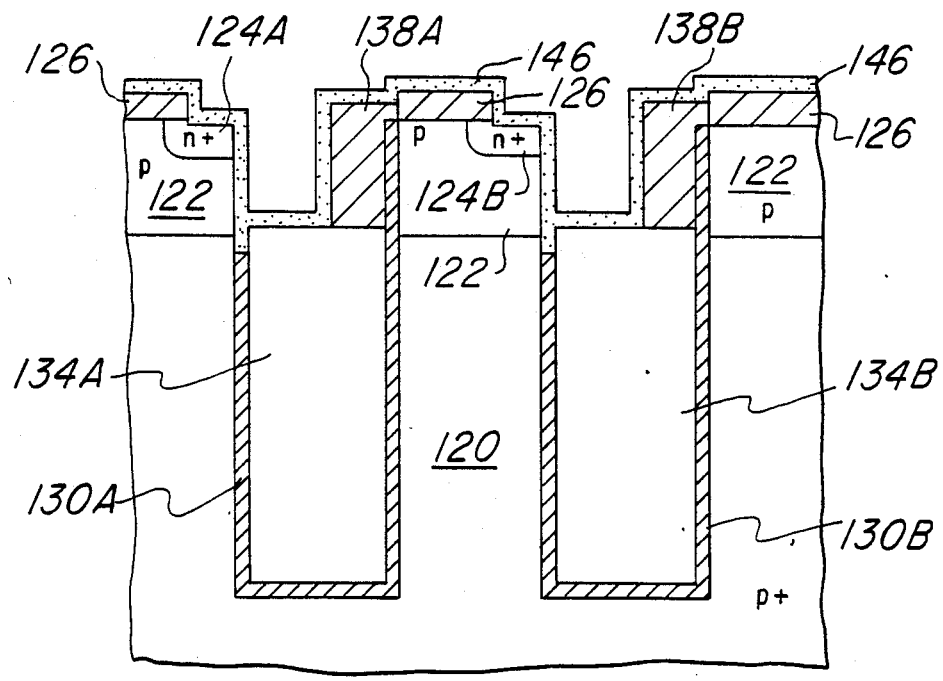
Figure 7I:
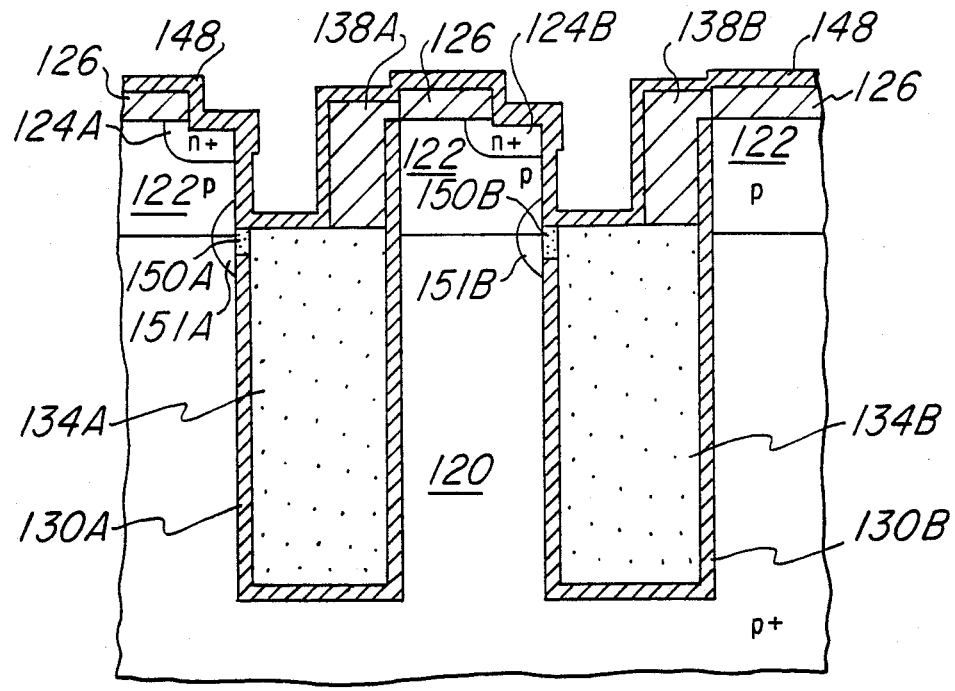

Photoresist layer 140 is removed and polycrystalline silicon layer 146 is deposited to a thickness of approximately 150 Å by chemical vapor deposition of silane. The thickness of polycrystalline silicon layer 146 is chosen so as to fill openings 144A and 144B as shown in FIG. 7H. The structure of FIG. 7H is then subjected to an oxidation process in a steam ambient at a temperature of a approximately 900° C. for a period of 10 minutes. This oxidation process completely oxidizes polycrystalline silicon layer 146 to provide silicon dioxide layer 148 having a thickness of 400 Å as shown in FIG. 7I. Because of its position relative to the oxidizing ambient, the portion of polycrystalline silicon layer 146 (FIG. 7H) in openings 144A and 144B will not oxidize thus leaving polycrystalline silicon buried lateral contacts 150A and 150B. Silicon dioxide layer 148 is removed by wet etching using dilute hydrofluoric acid and then regrown on the exposed silicon surfaces by thermal oxidation in an oxygen ambient at approximately 850° C. for approximately 80 minutes to form a new silicon dioxide layer 148 which serves as a high quality gate oxide. During the oxidation process N-type dopant atoms in polycrystalline silicon plugs 134A and 134B will diffuse through buried lateral contacts 150A and 150B and form N-type regions 151A and 151B. Polycrystalline silicon layer 154 is then deposited using chemical vapor deposition of silane to a thickness of approximately 4,500 Å and patterned to form gates and word lines as shown in FIG. 6.

Figure 8:
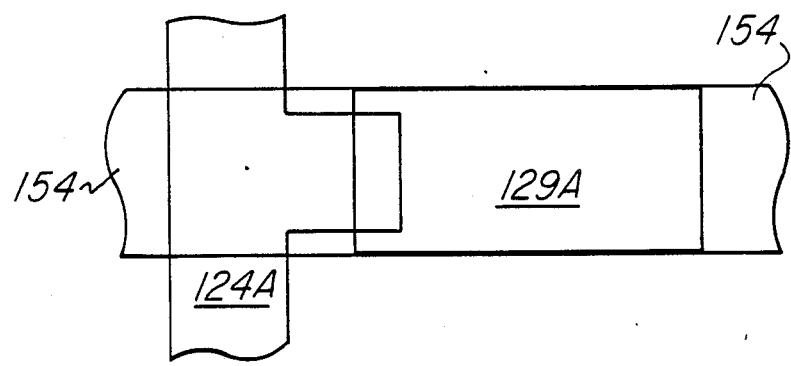
FIG. 8 is a plan view diagram depicting one layout scheme for implementation with the memory cell shown in FIG. 6.

A plan view diagram showing the relative positions of trench 129A, word line 154 and N+ region 124A, which serves as a bit line, are shown in FIG. 8.

FIGS. 9A through 9M are side view schematic diagrams depicting processing steps for fabricating another embodiment of the present invention. The initial steps of the fabrication process include forming P-type epitaxial layer 222, having a thickness of approximately 4$\mu$ on the surface of P+ type substrate 220, forming silicon dioxide layer 226 by thermal oxidation or chemical vapor deposition to a thickness of approximately 600 Å, and forming silicon nitride layer 228 by chemical vapor deposition, having a thickness of approximately 1,500 Å. Silicon nitride layer 228 is then patterned and etched to provide a mask for etching trenches 229A and 229B. Trenches 229A and 229B are etched using an anisotropic etching process such as described in copending application Ser. No. 730,701 to a depth of approximately 8$\mu$.

Figure 9A:
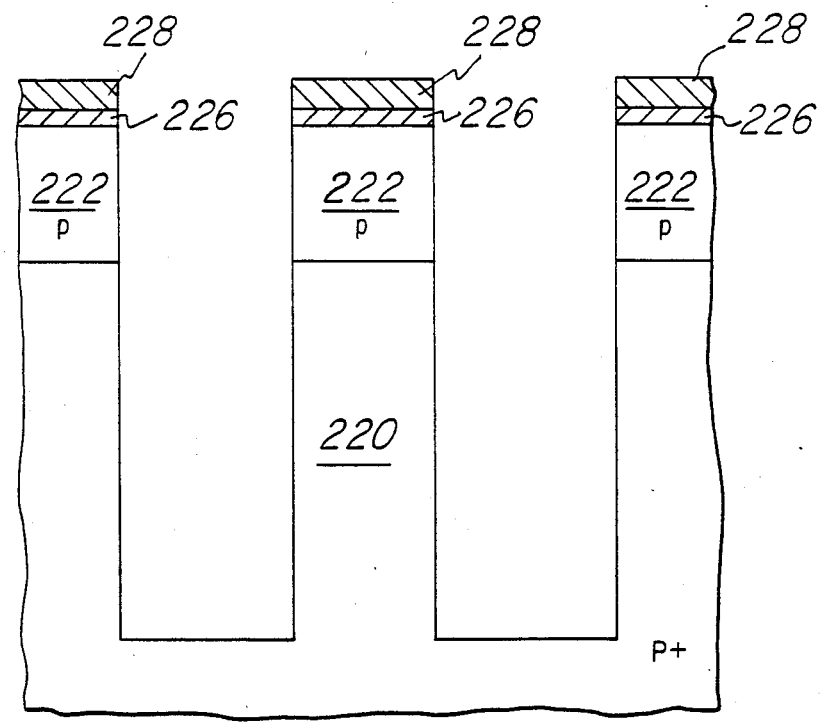
FIGS. 9A through 9O are side view schematic diagrams showing another process, which is an embodiment of the invention, for fabricating a memory cell, which is another embodiment of the present invention.
Figure 9B:
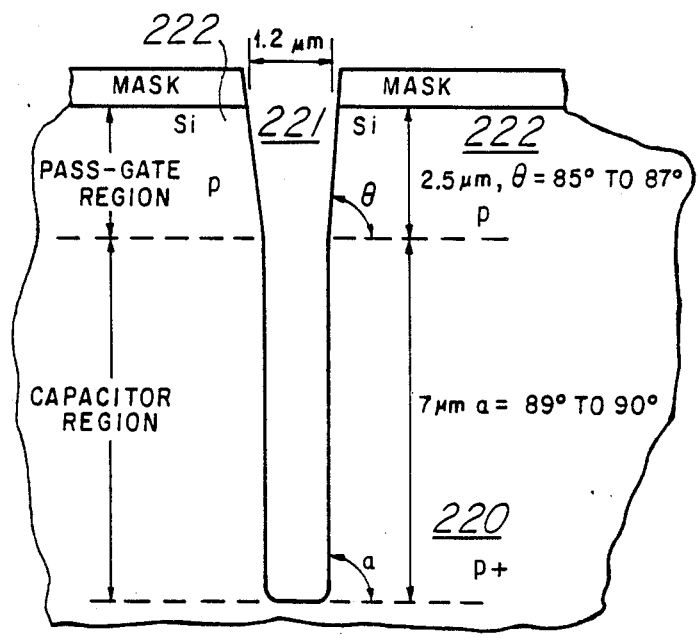

An optimal trench structure is shown in FIG. 9B. In the area labeled "pass-gate region", side walls having an angle 85° to 87° relative to the surface of epitaxial layer 22 are formed. The chemistry of the etchant is then altered so that the sidewalls of the trench in the area labeled "capacitor region" are nearly 90°. The shallower angle in the pass-gate region allows for adjusting the threshold voltage of the cell pass transistor by ion implanting into the cell channel regions, for example channel regions 152A and 152B (FIG. 6). On the other hand, the nearly vertical sidewalls of the capacitor region allow the etchant to reach deeper into the substrate before the trench tapers to a point. One technique for forming a trench such as trench 221 is described in copending application Ser. No. 730,701.

Figure 9C:
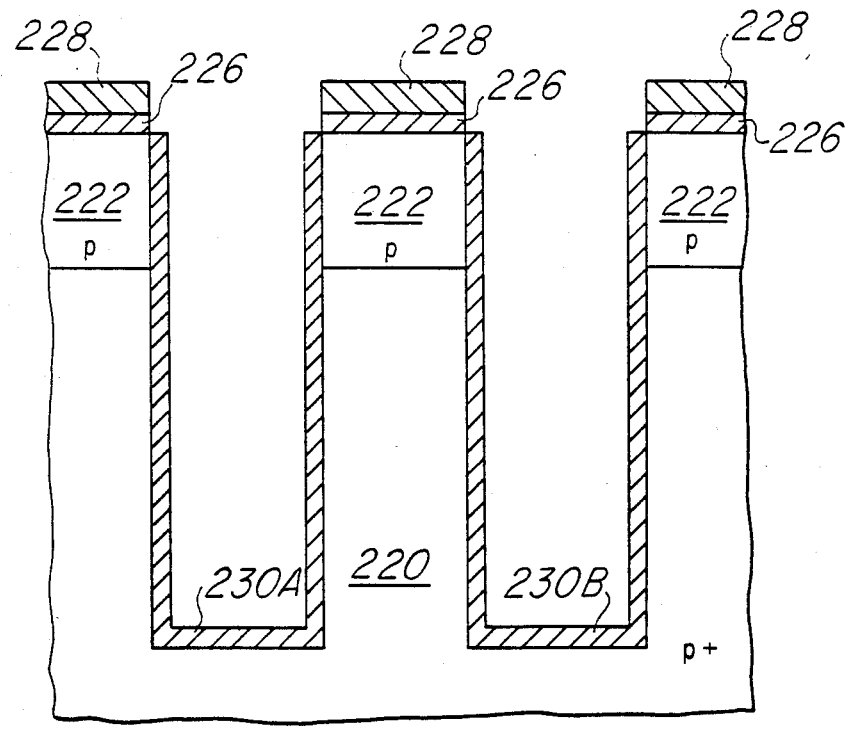

The structure of FIG. 9A is then subjected to thermal oxidation in oxygen at a temperature of approximately 850° C. of approximately 80 minutes. This forms silicon dioxide layers 230A and 230B to a thickness of approximately 150 Å as shown in FIG. 9C. Alternatively, silicon dioxide layers 230A and 230B may be replaced with a silicon oxy/nitride stack or any of several dielectric materials.

Figure 9D:
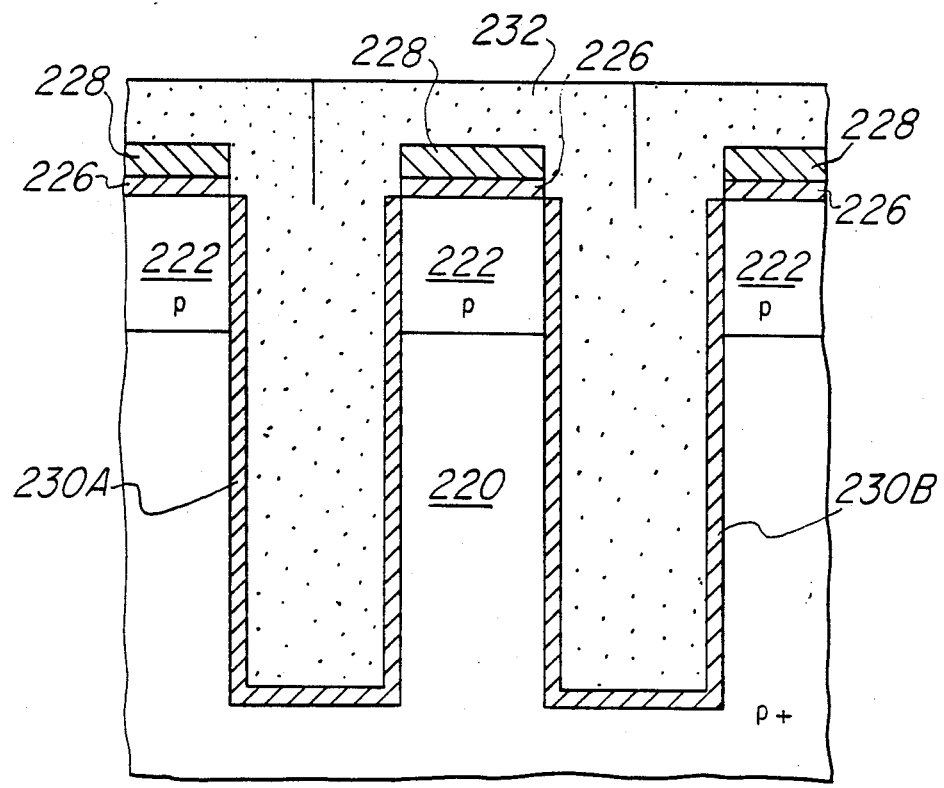

A deposition of heavily doped N type polycrystalline silicon using chemical vapor deposition of silane to form polycrystalline silicon layer 232 on a structure of FIG. 9C is then performed as shown in FIG. 9D. The thickness of polycrystalline silicon layer 232 is chosen so as to completely fill trenches 229A and 229B (FIG. 9A). The thickness must be at least approximately half the minimum width of the trench. For example, with a trench $1\mu$ by $2\mu$ wide, a polycrystalline silicon deposition of at least 5,000 Å (one half of one $\mu$) is necessary to fill the trench.

Figure 9E:
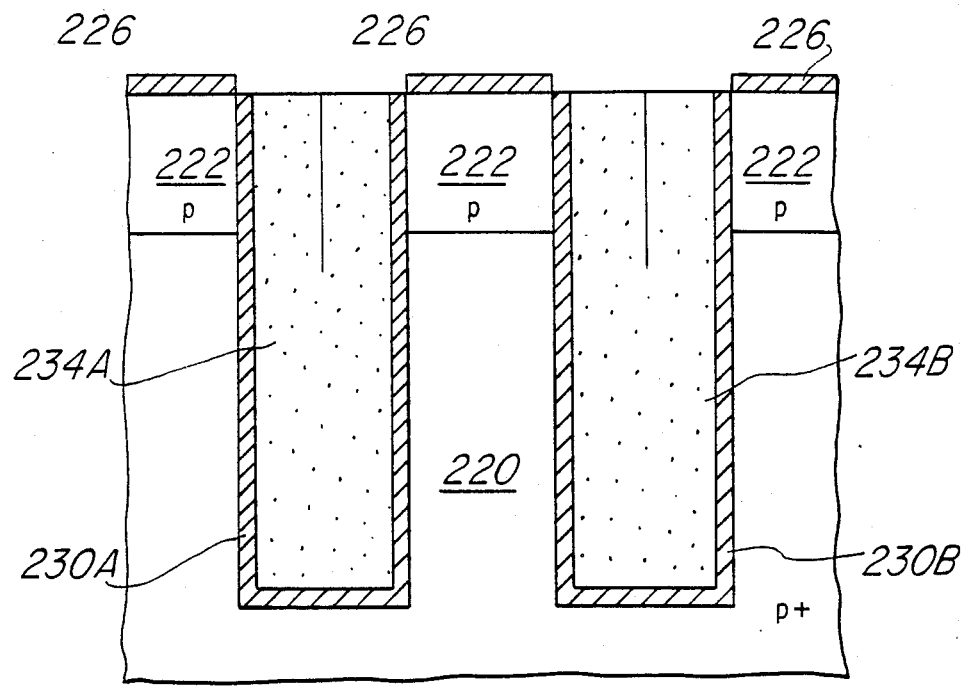
Figure 9F:
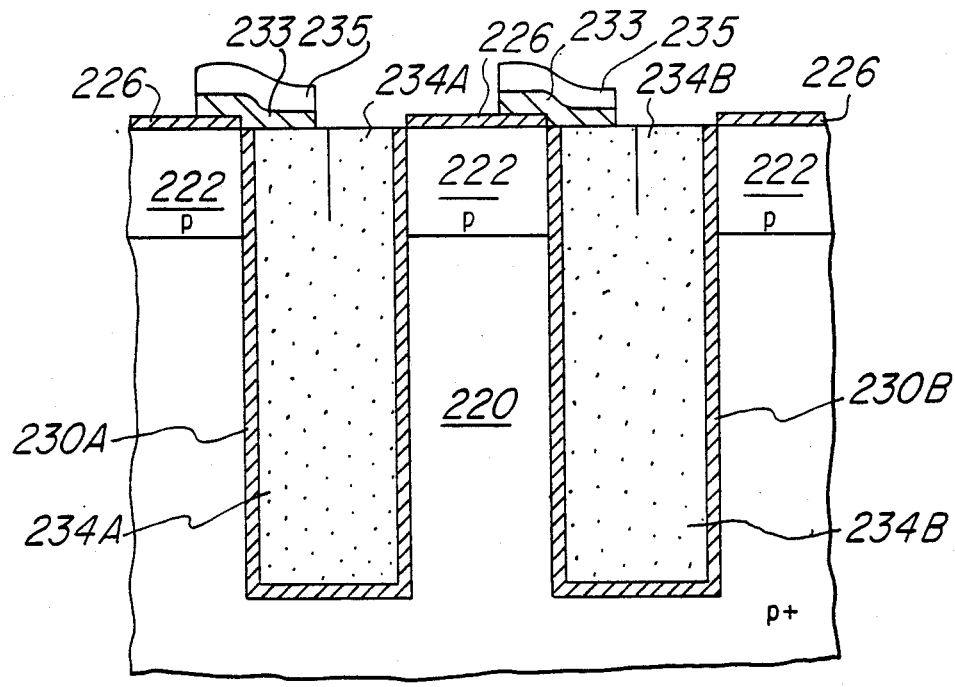
Figure 9G:
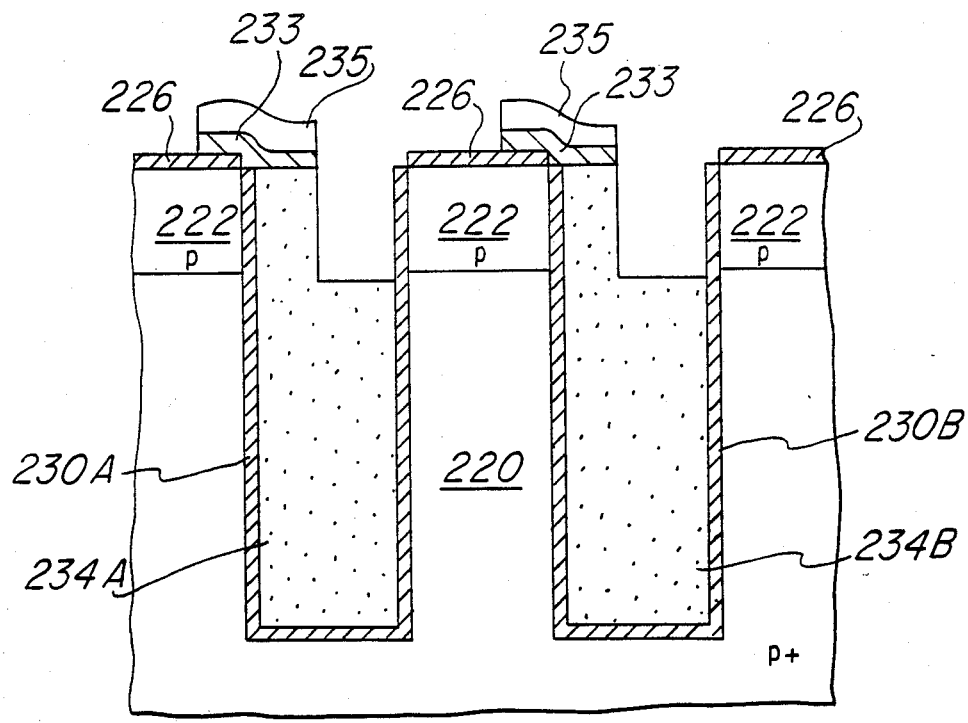
Figure 9H:
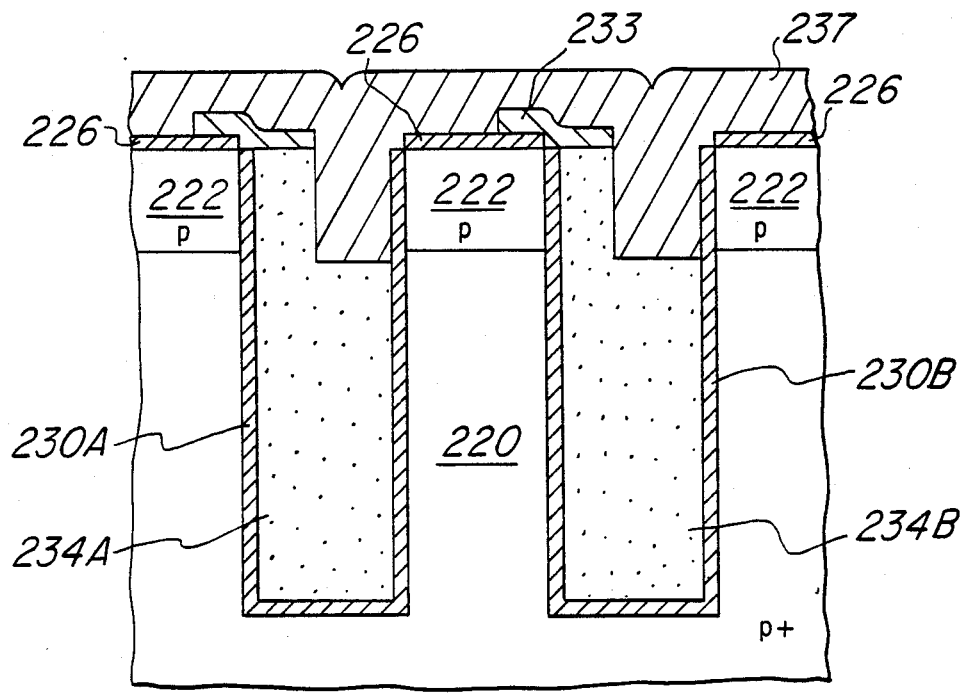

An isotropic etching process is then performed on polycrystalline layer 232 in order to etch polycrystalline silicon layer 232 back to a level approximately even with the mouth of the trench as shown in FIG. 9E. Silicon nitride layer 228 is then removed using one of many etching techniques. The resulting structure includes polycrystalline silicon plugs 234A and 234B. Silicon nitride layer 233 and photoresist layer 235 are deposited using chemical vapor deposition and liquid deposition, respectively, to thicknesses of 1,000 Å and $1\mu$, respectively, and then patterned and etched to provide the structure shown in FIG. 9F. Silicon nitride layer 233 and photoresist layer 235 serve as an etch mask for anisotropically etching polycrystalline silicon plugs 234A and 234B using a HCl/HBr plasma. The resulting structure is shown in FIG. 9G. Photoresist layer 235 is then removed using common photoresist removal techniques. Silicon dioxide layer 237 is deposited to a thickness of approximately 8,000 Å using chemical vapor deposition as shown in FIG. 9H. Silicon dioxide layer 237 is etched and planarized using resist etch-back planarization down to the mouth of the trench leaving silicon dioxide plugs 238A and 238B as shown in FIG. 9I.

Figure 9I:
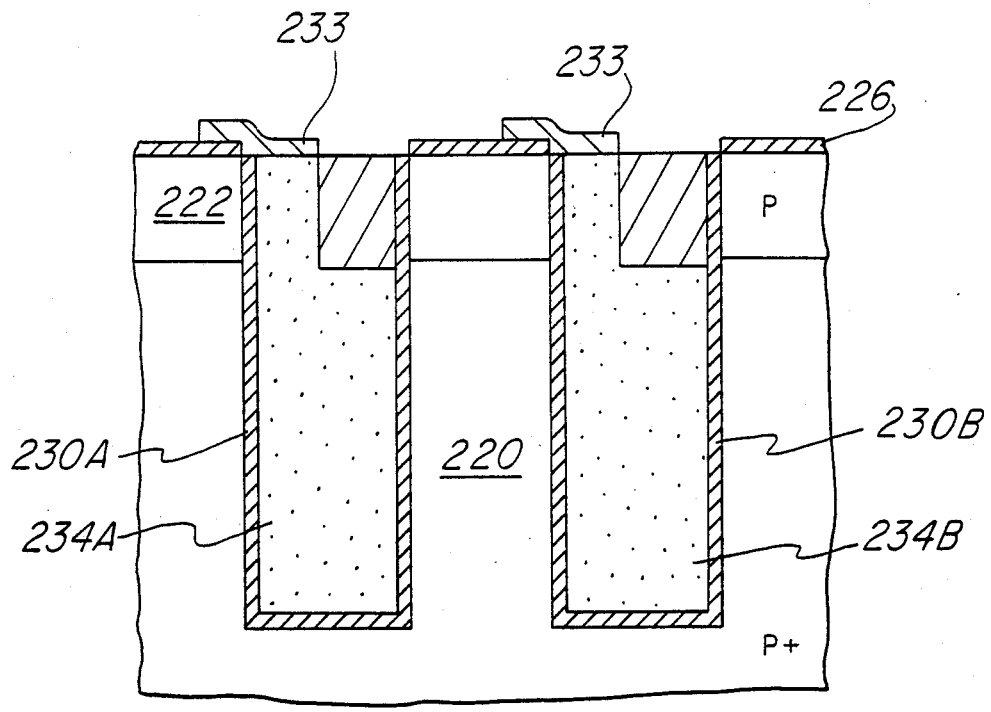
Figure 9J:
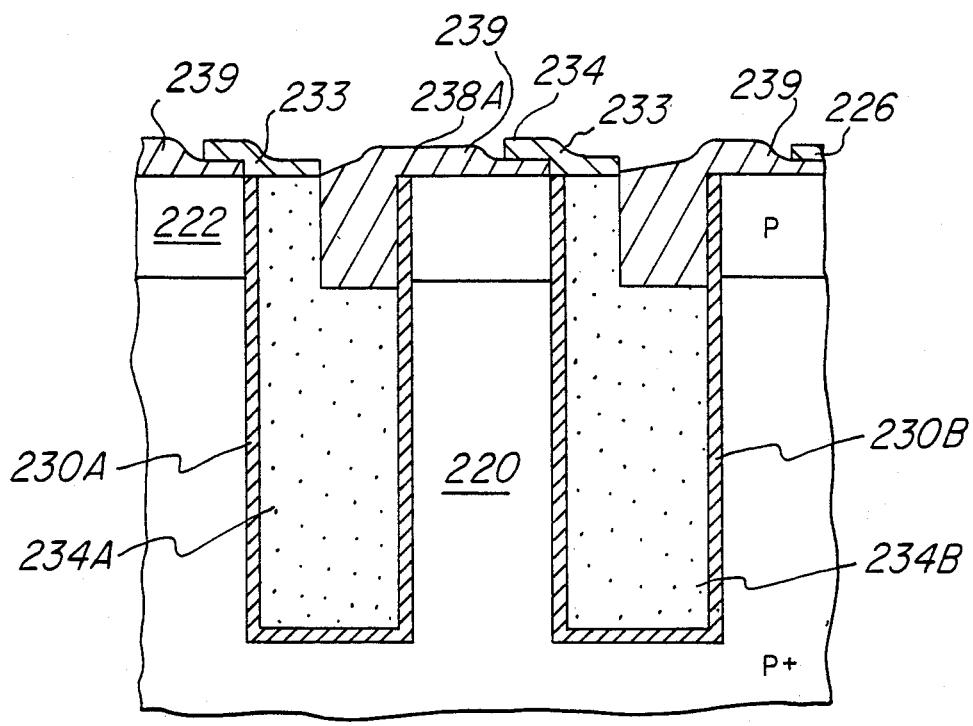

The structure of FIG. 9I is then subjected to a thermal oxidation step in an steam ambient at a pressure of approximately 10 atm. at a temperature of approximately 1,000° C. for approximately 8 minutes to form field silicon dioxide regions 239 having a thickness of approximately 4,000 Å as shown in FIG. 9J. Silicon nitride layer 233 and is then removed by wet etching.

Figure 9K:
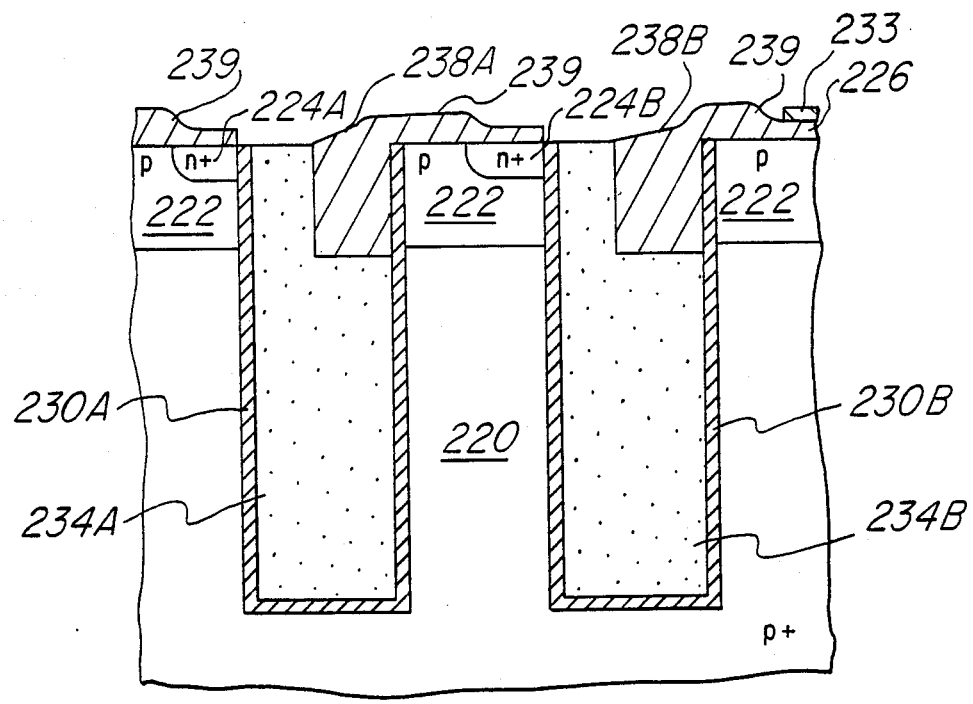

The structure of FIG. 9J is then subjected to an ion implantation of N type dopant ions such as Arsenic at an energy of approximately 180 KeV and a density of approximately $1 \times 10^{16}$ ions/cm$^3$. This ion implantation forms N+ regions 224A and 224B as shown in FIG. 9K. Polycrystalline silicon plugs 234A and 234B will be doped by the ion implantation, but the doped portion of polycrystalline silicon plugs 234A and 234B is removed in the following step.

Figure 9L:
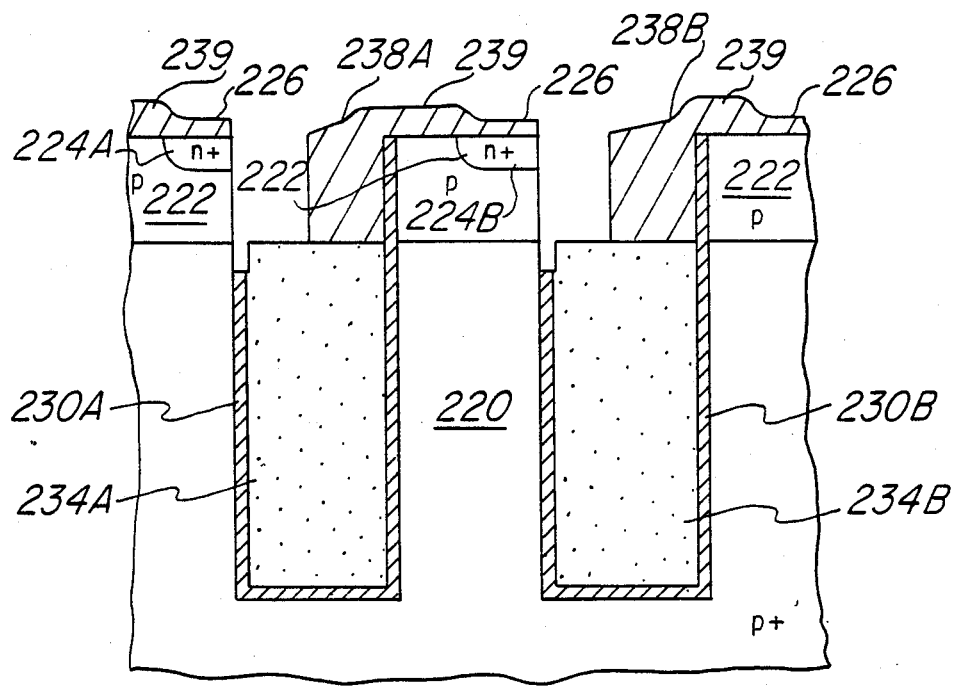

Polycrystalline silicon plugs 234A and 234B are then isotropically etched using a silicon etch that is highly selective to silicon dioxide such as a plasma of sulfur hexafluoride. Silicon dioxide layers 230A and 230B are then etched in a timed wet etch to remove the exposed area of silicon dioxide layers 230A and 230B and to over etch to provide notches 244A and 244B as shown in FIG. 9L. Several suitable etching liquid are known in the art for accomplishing the etch, such as dilute hydrofluoric acid.

Figure 9M:
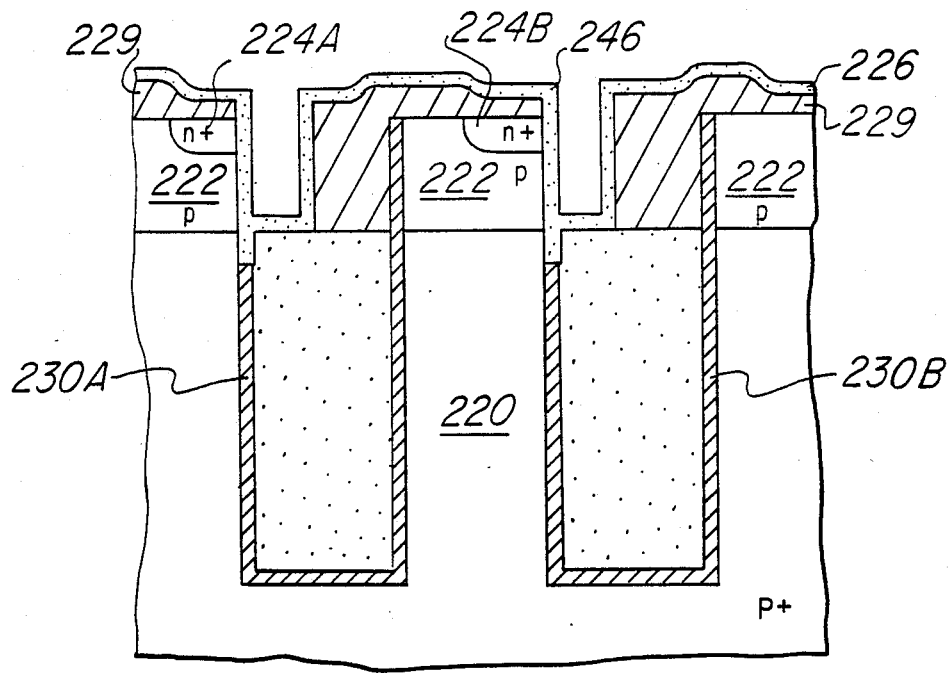

Polycrystalline silicon layer 246 is then deposited using chemical vapor deposition of silane to a thickness of approximately 200 Å as shown in FIG. 9M. The thickness of polycrystalline silicon layer 246 is chosen so as to fill openings 244A and 244B. Polycrystalline layer 246 is then wet etched in choline. This etching step removes polycrystalline silicon layer 246: however, because of its position relative to the etchant, the portion of polycrystalline silicon layer 246 (FIG. 9L) in openings 244A and 244B will not be removed, thus leaving polycrystalline silicon buried lateral contacts 240A and 250B. Subsequent heating steps cause N-type dopant atoms in polycrystalline silicon plugs 234A and 234B to diffuse through buried lateral contacts 250A and 250B and form N-type regions 251A and 251B. The resulting structure is shown in FIG. 9N.

Figure 9N:
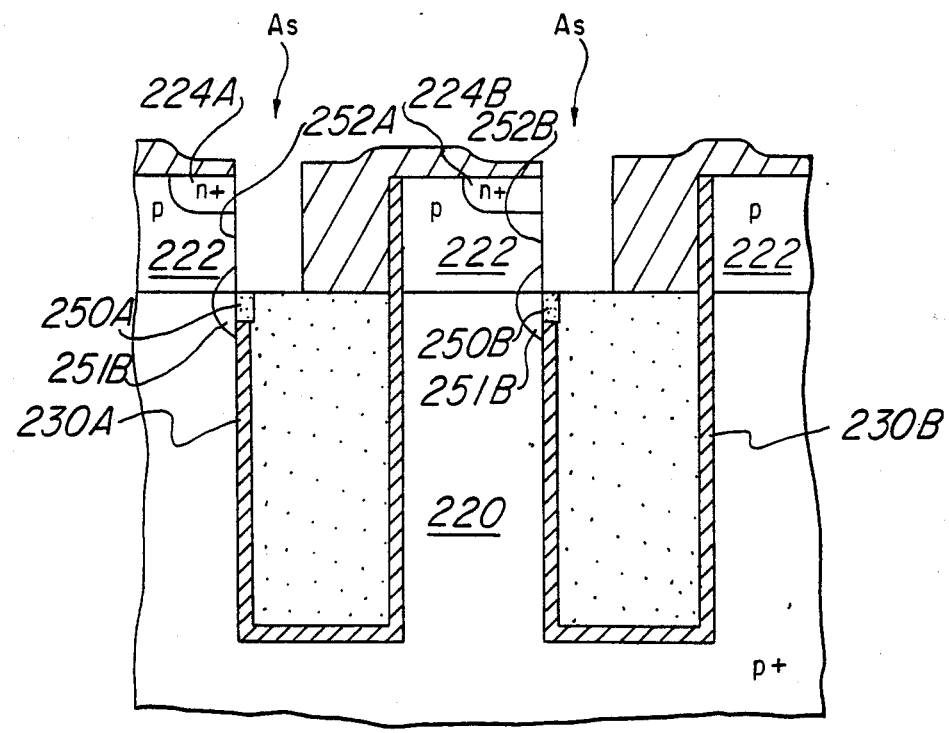
Figure 9O:
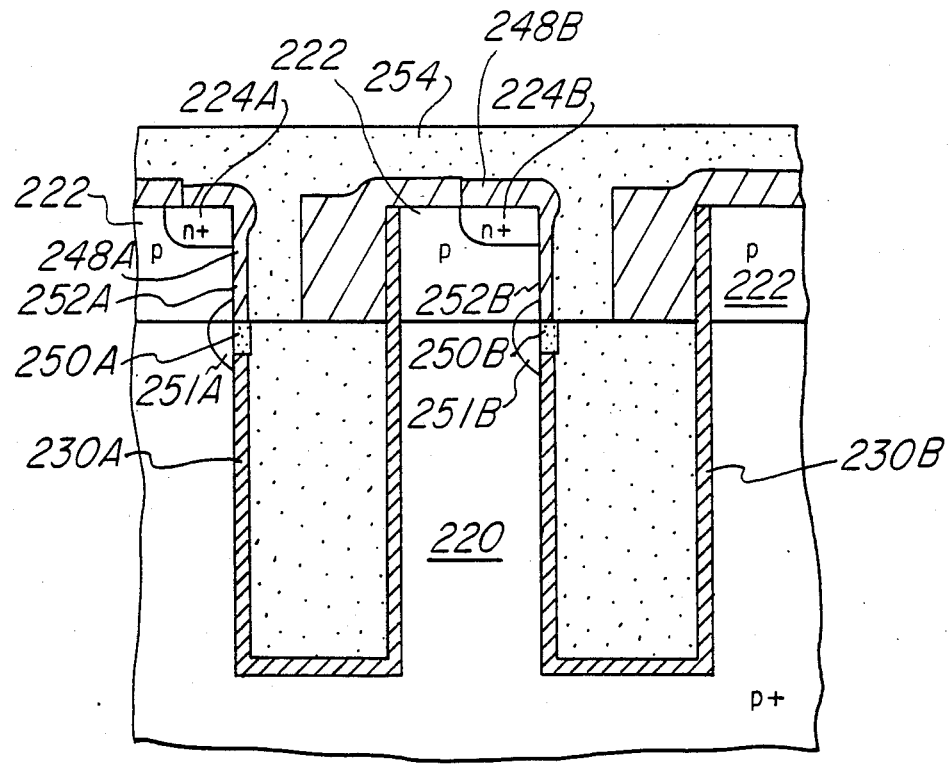

An oxidation step is the performed on the structure of FIG. 9N using a steam ambient at approximately 850° C. for approximately 30 minutes to form silicon dioxide layers 248A and 248B having a thickness of approximately 250 Å which will serve as gate oxide layers. The portion of silicon dioxide layers 252A and 252B formed by oxidation of N+ regions 224A and 224B and polycrystalline silicon plugs 234A and 234B will be much thicker than that formed by oxidation of epitaxial layer 222 because of the higher rate of oxidation of heavily doped silicon. Because silicon dioxide layers 229 are iondistinguishable from silicon dioxide layers 252A and 252B, silicon dioxide layers 229 are part of silicon dioxide layers 252A and 252B in FIG. 9O. Polycrystalline silicon layer 254 is then deposited using chemical vapor deposition of silane to a thickness of approximately 450 Å and patterned to form gates and word lines as shown in FIG. 9O.

Many modifications of the preferred embodiments are available which still fall within the scope of the invention in that such modifications, either singly or in combinations, do not disrupt the storage of signal charge by the capacitor nor the on/off function of the transistor, Such modifications include the following:

The trench cross section could be whatever shape is convenient, such as circular, rectangular, arbitrary convex, corrugated, even multiconnected (i.e. involving multiple trenches) and could even vary along the vertical, continuously or in steps or both. Similarly, the trench sidewalls need not be vertical, rather any geometry that can be processed should work to a greater or lesser extend, such as bulging, tapered, and sloped sidewalls; indeed, any simply connected trench is functionally equivalent to the parallelpiped of the preferred embodiment. Lastly, the dimensions of the trench (depth, cross sectional area, diameter, and so forth) may be varied but in practice are a tradeoff of process convenience, capacitance required, substrate area, and so forth. Of course, the capacitance required depends upon the refresh time, transistor leakage current, supply voltage, soft error immunity, capacitor leakage current, et cetera.

The capacitor insulator can be of any convenient material such as oxide, nitride, oxide-nitride, oxide-nitride-oxide, and other stack combinations, and the oxide could be thermally grown, LPCVD, grown dry in in steam, and so forth. The thickness of the insulator is a tradeoff of process convenience, insulator reliability, dielectric constant, breakdown voltage, and so forth and may vary widely. Of course, if the cell and array are fabricated in semiconductor material other than silicon (such as gallium arsenide, aluminum gallium arsenide, mercury cadmium telluride, germanium, indium phosphide, and so forth), the capacitor insulator will be a corresponding material. Also, for the capacitor formed by a reverse biased junction, the doping profiles may be varied, the choice will be a tradeoff of process convenience, cell size, capacitor performance, and so forth. Similarly, amorphous silicon could be used in place of polysilicon, and the etch back to form the crevices may be wet or dry (plasma).

The transistor can be formed to operate with a variety of threshold voltages by adjusting the threshold voltage (such as by a shallow diffusion on the channel just prior to gate oxide growth or deposition). The doping levels and the doping species can be varied so as to vary the transistor characteristics; note that the transistor channel length is determined approximately by trench depth and that n-channel and p-channel device require oppositely doped regions. The transistor gate may be polysilicon, metal, silicide, and so forth. All of these variations affect performance of the transistor but are acceptable if the transistor adequately performs as a pass transistor for the cell in view of the other characteristics of the cell including required read and write times, the capacitance, the refresh time, and so forth.

The scope of the invention is not limited to the described embodiments in any way but is only limited by the claims appended hereto.

TECHNICAL ADVANTAGES

The described embodiments of the present invention include memory cells and methods for fabricating these memory cells. The memory cells include a pass transistor and a storage capacitor in a single trench. The pass transistor occupies a small portion of the sidewall of the trench. By limiting the transistor to this small portions, capacitive coupling between the bitline and the storage capacitor, and the word line and the storage capacitor is minimized. In addition, because the transistor provides leakage paths for loss of charge from the storage capacitor, minimizing the area occupied by the transistor minimizes leakage. Also, because cross talk between cells occurs mainly from pass transistor to adjacent pass transistor and because the described memory cells provide a large portion of the circumference of the memory cell where on pass transistor exists, the described cells may be more densely packed in an array.

We claim:

1. A memory cell comprising a trench formed in a semiconductor substrate;
    an insulating layer formed on the walls of said trench;
    a conductive connection formed through said insulating layer to said substrate providing a conductive path to a source region formed in said substrate on one side of said trench:
    a drain region formed at the mouth of said trench on said one side of said trench defining a channel region between said source and said drain;
    an insulating plug filling the remaining portion of said trench excepting a portion of said trench adjacent to said drain region and said source region; and
    a conductive gate formed in the remaining portion of said trench.

2. The memory cell of claim 1 wherein said trench is in the form of a right rectangular parallelepiped having its major axis perpandicular to a surface of said substrate.

3. The memory cell of claim 1 wherein said trench has a depth into said substrate of 8 $\mu$.

4. The memory cell of claim 1 wherein said substrate comprises crystalline silicon.

5. The memory cell of claim 1 wherein the portion of said insulating layer between said gate and said substrate is thicker than the portion of said insulating layer between said conductive layer and said substrate.

6. The memory cell of claim 5 wherein said portion of said insulating layer between said gate and said substrate is 250 Å thick and the other portions of said insulating layer are 150 Å thick.

7. A memory array comprising a plurality of memory cells, each cell comprising
    a trench formed in a semiconductor substrate;
    an insulating layer formed on the walls of said trench;
    a conductive layer filling a portion of said trench;
    a conductive connection formed through said insulating layer to said substrate providing a conductive path to a source region formed in said substrate on one side of said trench;
    a drain region formed at the mouth of said trench on said one side of said trench defining a channel region between said source and said drain;
    an insulating plug filling the remaining portion of said trench excepting a portion of said trench adjacent to said drain region and said source region; and
    a conductive gate formed in the remaining portion of said trench.

8. The memory cell of claim 7 wherein said trench is in the form of a right rectangular parallelpiped having its major axis perpandiculur to a surface of said substrate.

9. The memory cell of claim 7 wherein said trench has a depth into said substrate of 8 $\mu$.

10. The memory array of claim 7 wherein said substrate comprises crystalline silicon.

11. The memory array of claim 7 wherein the portion of said insulating layer between said gate and said substrate is thicker than the portion of said insulating layer between said conductive layer and said substrate.

12. The memory array of claim 7 wherein said portion of said insulating layer between said gate and said substrate is 250 Å thick and the other portions of said insulating layer are 150 Å thick.

* * * * *